(12) United States Patent
Kurosaki

(10) Patent No.: US 6,301,156 B1
(45) Date of Patent: Oct. 9, 2001

(54) NONVOLATILE SEMICONDUCTOR MEMORY DEVICE

(75) Inventor: Kazuhide Kurosaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/635,869

(22) Filed: Aug. 10, 2000

(30) Foreign Application Priority Data

Nov. 9, 1999 (JP) .................................................. 11-318824

(51) Int. Cl.[7] .................................................. G11C 16/06
(52) U.S. Cl. ................................... 365/185.2; 365/185.21
(58) Field of Search ........................... 365/185.2, 185.21, 365/185.18, 210

(56) References Cited

U.S. PATENT DOCUMENTS

| | | | |
|---|---|---|---|
| 5,559,737 | * | 9/1996 | Tanaka et al. ................... 365/185.25 |
| 5,602,775 | * | 2/1997 | Vo ...................................... 365/185.01 |
| 5,757,697 | * | 5/1998 | Briner .............................. 365/185.21 |
| 5,773,997 | * | 6/1998 | Stiegler .................................... 327/53 |
| 5,828,616 | * | 10/1998 | Bauer et al. ........................... 365/210 |
| 5,936,888 | * | 8/1999 | Sugawara ........................... 365/185.2 |
| 6,219,290 | * | 2/2001 | Chang et al. ......................... 365/207 |

FOREIGN PATENT DOCUMENTS 7-273227    10/1995    (JP) .

* cited by examiner

Primary Examiner—Amir Zarabian
Assistant Examiner—Anh Phung
(74) Attorney, Agent, or Firm—Arent Fox Kintner Plotkin & Kahn, PLLC

(57) ABSTRACT

In addition to the capacitors connected conventionally in parallel to an output of a bit line at the source of a reference cell 30, a capacitor C20 is provided. Further, a capacitor C21 that is provided which is connected during data reading operation and program verification operation. This capacitor C21 is disconnected during erase verification operation. Further, a capacitor C22 is provided which is connected during the program verification operation. Accordingly, it is possible to increase or decrease the electric potential of the signal SAREF output from the reference cell 30 during program verification operation and erase verification operation.

6 Claims, 5 Drawing Sheets

NONVOLATILE SEMICONDUCTOR MEMORY DEVICE

FIELD OF THE INVENTION

The present invention relates to an electrically rewritable nonvolatile semiconductor memory device such as a flash memory or the like. This invention particularly relates to a nonvolatile semiconductor memory device for carrying out a program verification and an erase verification based on a change in current charged to and discharged from capacitors connected to a bit line at the source of a reading cell and to a bit line at the source of a reference cell respectively.

BACKGROUND OF THE INVENTION

FIG. 1 is a circuit diagram which shows only the required components of a conventional nonvolatile semiconductor memory. Only those components that are necessary for explanation of data reading operation, program verification operation and erase verification operation are shown in this figure.

The nonvolatile semiconductor memory device shown in FIG. 1 includes a memory cell array 20 having a plurality of memory cells (also called as reading cell) disposed in a grid fashion, a row decoder 22, and bit lines 21 at the drain side and bit lines 23 at the source side. The memory cells store data. The row decoder 22 can select one row of the memory cells. That is, the row decoder 22 can select one of the word lines WL0 to WLn. The bit lines 21 and the bit lines 23 can selects a column of the memory cells of the memory cell array 20 based on a column signal input from a not shown column decoder.

Further, a reference cell 30 in the nonvolatile semiconductor memory device decides a storage state of the data at the time of reading the data. The reference cell 30 also carries out the operations like program verification and erase verification. Further, a sense amplifier 40 compares the signals output from the memory cell array 20 with the signals output from the reference cell 30.

Further, a reference word line driver 32 applies voltages corresponding to data reading operation, program verification operation, and erase verification operation respectively to a control gate of the reference cell 30. A reading voltage generator 24 generates a voltage required for reading the data. A program verification voltage generator 26 generates a voltage required for the program verification. An erase verification voltage generator 28 generates a voltage required for the erase verification.

Capacitance is intentionally generated at the bit lines 23 at the source of the memory cell array 20 and at the bit lines at the source of the reference cell 30 although no capacitors have been specifically shown in the figure. These capacitors are charged based on the signal output from the memory cell array 20. A sense amplifier 40 detects a potential difference based on a difference between charging speeds of these capacitors. The operation of the sense amplifier 40 will be explained later. Data reading operation, program verification operation and erase verification operation are performed based on the detected potential difference. Usually, these capacitors are provided in parallel to two input lines within the sense amplifier 40 respectively.

The reading cells or the reference cell 30 is electrically rewritable nonvolatile semiconductor memory such as, for example, an EEPROM (Electrically Erasable and Read-Only Memory) or the like. This nonvolatile semiconductor memory consists of a floating gate covered with an insulator and disposed between a source and a drain formed as n-type diffusion layers on a p-type silicon substrate, and a control gate for injecting a hot electron into the floating gate and for controlling a gate voltage.

The data reading operation, the program verification operation and the erase verification operation by the nonvolatile semiconductor memory device will be explained in this order. Data writing (that is, programming) is carried out based on, for example, a source voltage Vs=0 [V], a drain voltage Vd=5 to 6 [V] and a control gate voltage Vcg=12 [V] (that is, program voltage), and by injecting a hot electron into the floating gate from the drain.

Data erasing (that is, erasing) is carried out based on, for example, a source voltage Vs=5 [V] (that is, power source voltage) and a control gate voltage Vcg=−8.5 [V] (that is, erase voltage), with the drain in an open state, and by extracting an electron from the floating gate into the source.

Data Reading Operation:

During the data reading operation, p-type MOS transistors Tr11 and Tr21 are made ON using the signals PD1 and PD2 respectively.

The address of a cell to be read is specified as follows. That is, the not shown column decoder turns ON the MOS transistors connected to the bit line 21 at the drain side and the bit line 23 at the source side respectively (thus a bit line is selected), and the row decoder 22 applies a reading voltage supplied from the reading voltage generator 24 to the control gate of the reading cell (thus a word line is selected).

Thus, a reading cell from which data is to be read out is selected or specified by selecting a bit line and a word line corresponding to that cell. After the reading cell is selected, the MOS transistors Tr12 and Tr13 are made ON with a column selection signal CS. As a result, the selected bit line becomes valid, and it becomes possible to read the data stored in the reading cell.

On the other hand, with respect to the reference cell 30, there are disposed MOS transistors Tr22, Tr23, Tr25 and Tr26 having characteristics similar to those of the MOS transistors that are controlled in the operation of the reading cell. These transistors are disposed by taking into consideration characteristics of currents that are input into the sense amplifier 40 during the data reading operation, program verification operation and erase verification operation respectively. These MOS transistors are always ON.

The reference word line driver 32 applies a reading voltage supplied from the reading voltage generator 24, to the control gate of the reference cell 30 via a word line WLref, along the operation of the memory cell array 20.

In the memory cell array 20 and the reference cell 30 both, the MOS transistors Tr14 and Tr24 are turned ON by a signal EQ, and electric charges stored in the capacitors are discharged (reset). The signal EQ is again input into these transistors at a suitable timing due to which these transistors turn OFF.

Thus, a signal output from the bit line 23 at the source of the memory cell array 20 is input as a signal SAIN into the sense amplifier 40 via the MOS transistor Tr13. This signal SAIN represents a change of the electric potential of the capacitor as explained above.

In the reference cell 30, a signal output from the bit line at the source side is input as a signal SAREF into the sense amplifier 40. This signal SAREF also represents a change of the electric potential of the capacitor as explained above.

The sense amplifier 40 detects a change in the potential between the signal SAIN and the signal SAREF. In other words, the sense amplifier 40 detects a speed of charging to each of the above mentioned capacitors, thereby to calculate a difference in the potential between the signal SAIN and the signal SAREF.

For example, consider a case where the charging speed of the capacitor corresponding to the memory cell array 20 is lower than the charging speed of the capacitor corresponding to the reference cell 30 and that the potential of the signal SAIN is smaller than the potential of the signal SAREF at a timing when the MOS transistor Tr15 is turned ON with a signal LT. In this case the sense amplifier 40 decides that hot electrons have been injected into the floating gate, and outputs data "0" as a signal OUT.

On the other hand, when the charging speed of the capacitor corresponding to the memory cell array 20 is higher than the charging speed of the capacitor corresponding to the reference cell 30, and when the potential of the signal SAIN is larger than the potential of the signal SAREF at a timing when the MOS transistor Tr15 is turned ON with the signal LT, the sense amplifier 40 decides that electrons have been extracted from the floating gate, and outputs data "1" as the signal OUT.

This data reading operation is carried out based on, for example, a source voltage Vs=0 [V], a drain voltage Vd=1 [V] and a control gate voltage Vcg=5 [V].

Program Verification Operation:

In the program verification operation, a reading cell of the memory cell array 20 is selected at in a similar manner as in the data reading operation. However, different from the data reading operation, the reference word line driver 32 applies the program verification voltage generated by the program verification voltage generator 26 to the control gate of the reference cell 30. It should be noted that, the reading voltage generated by the reading voltage generator 24 is applied in the data reading operation.

The program verification voltage is lower than the reading voltage. When the signal SAIN becomes much smaller than the signal SAREF having a potential smaller than that during the data reading operation at a timing when the MOS transistor Tr15 is turned ON with the signal LT, the sense amplifier 40 decides that the program operation is carried out normally, and outputs data "0" as a signal OUT.

Erase Verification Operation:

In the erase verification operation, a reading cell of the memory cell array 20 is selected at in a similar manner as in the data reading operation. However, different from the data reading operation, the reference word line driver 32 applies the erase verification voltage generated by the erase verification voltage generator 28 to the control gate of the reference cell 30. It should be noted that, the reading voltage generated by the reading voltage generator 24 is applied in the data reading operation.

The erase verification voltage is larger than the reading voltage. When the signal SAIN becomes much larger than the signal SAREF having a potential larger than that during the data reading operation at a timing when the MOS transistor Tr15 is turned ON with the signal LT, the sense amplifier 40 decides that the erase operation is carried out normally, and outputs data "1" as a signal OUT.

As explained above, according to the conventional nonvolatile semiconductor memory device, verification operation is carried out by increasing or decreasing the voltage to be applied to the control gate of the reference cell 30 in comparison to the voltage applied during a normal data reading operation.

Thus, the program verification voltage generator 26 is required in the conventional nonvolatile semiconductor memory device for generating the program verification voltage and the erase verification voltage generator 28 is required for generating the erase verification voltage. Provision of these two voltage generators makes the circuit scale of the nonvolatile semiconductor memory device large and complex. Further, provision of these two voltage generators hinder the possibility of power saving.

SUMMARY OF THE INVENTION

It is an object of the invention to provide a nonvolatile semiconductor memory device in a simple structure that can save energy, by avoiding the need for providing many voltage generators for carrying out a verification operation.

According to one aspect of the in vention, a nonvolatile semiconductor memory device comprises an e lectrically erasable/writable data-storing memory cell; a reference memory cell for making a decision about a storage state of the data-storing memory cell; a first capacitor and a second capacitor for charging current flowing to the reference memory cell; a sense amplifier for detecting a charging speed difference and a potential difference respectively between the first capacitor and the second capacitor; and a capacitance changing unit. This capacitance changing unit can connect a plurality of capacitors in parallel or disconnects these capacitors and thus change the capacitance of the second capacitor. When performing the program verification operation, the capacitance changing unit changes the capacitance of the second capacitor such that the capacitance is higher as compared to the same when the data reading operation is performed. When performing the erase verification operation, the capacitance changing unit changes the capacitance of the second capacitor such that the capacitance is lower as compared to the same when the data reading operation is performed.

Based on the above arrangement, it is possible to increase or decrease a charging speed of current flowing to the reference memory cell according to the program verification operation and the erase verification operation. Therefore, it is not necessary to change a voltage to be applied to the gate of the reference memory cell for each verification operation. In other words, it is not necessary to provide many voltage generators for the verification operations. The data reading operation and verification operations can be carried out based on the operation of the sense amplifier.

Other objects and features of this invention will become apparent from the following description with reference to the accompanying drawings.

DESCRIPTION OF THE PREFERRED EMBODIMENTS

Preferred embodiments of a nonvolatile semiconductor memory device relating to the present invention will be explained below with reference to the attached drawings. This invention is not limited to these embodiments.

A nonvolatile semiconductor memory device relating to a first embodiment will be explained first. The nonvolatile semiconductor memory device relating to the first embodiment does not have either the program verification voltage generator or the erase verification voltage generator that have been necessary in the conventional nonvolatile semiconductor memory device. Instead, the nonvolatile semiconductor memory device of the first embodiment have capacitors added to a bit line at the source of a reference cell, to be selected for each of a program verification operation and an erase verification operation. With this arrangement, the potential of a SAREF signal output from the reference cell side is changed for each verification operation.

Figure 1:
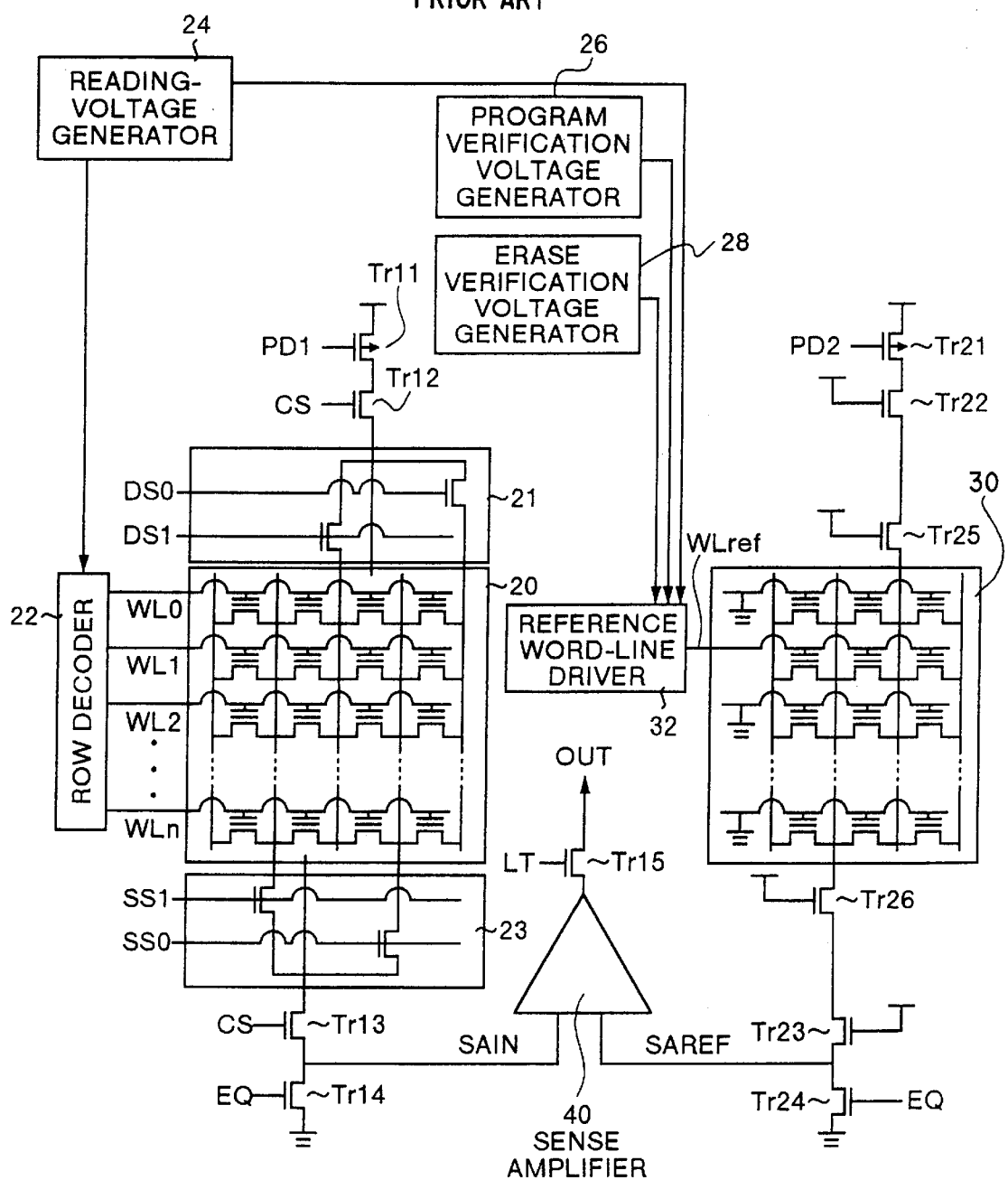
FIG. 1 is a circuit diagram showing required sections of a conventional nonvolatile semiconductor memory device.
Figure 2:
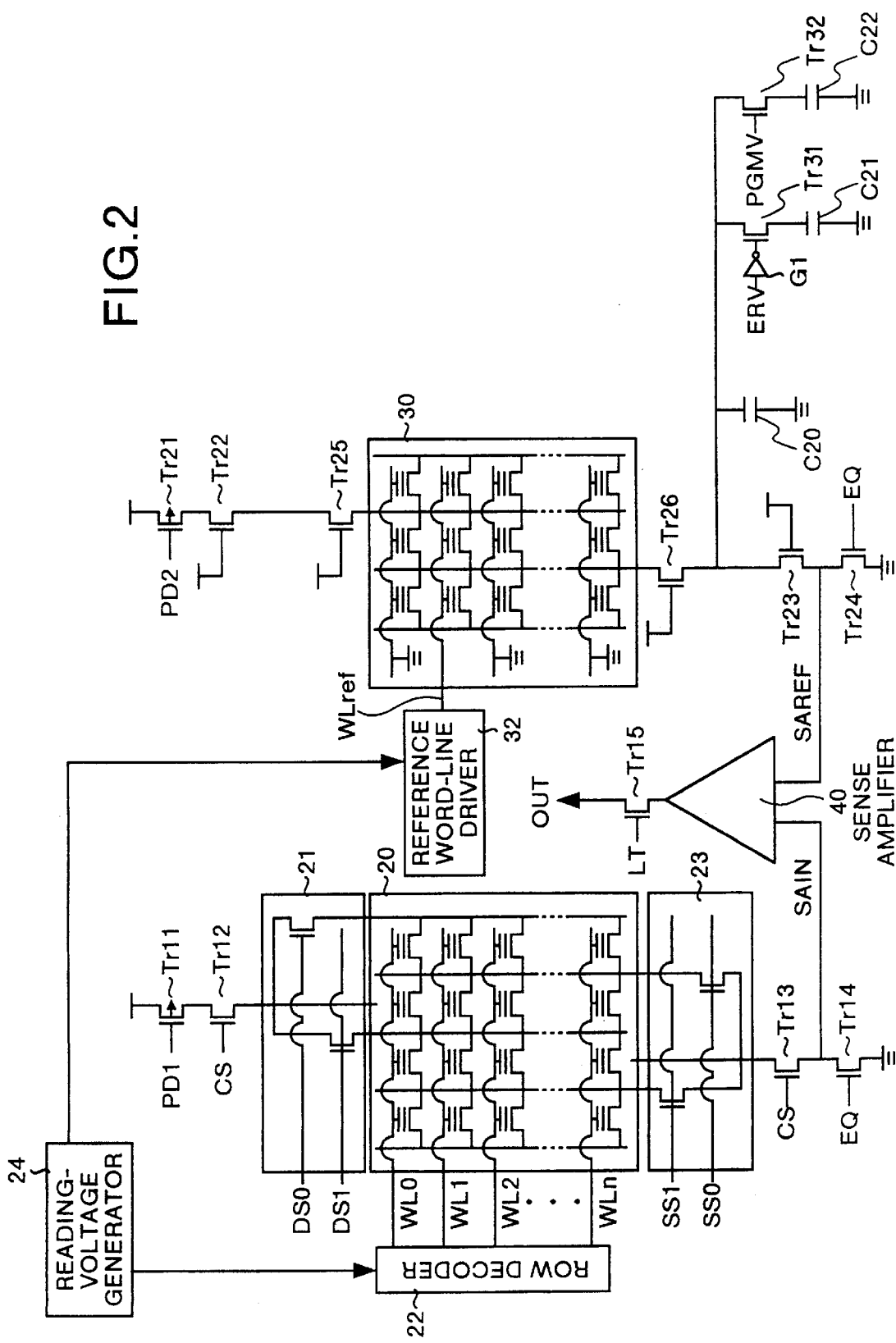
FIG. 2 is a circuit diagram showing required sections of a nonvolatile semiconductor memory device relating to a first embodiment of the present invention.

FIG. 2 is a circuit diagram which shows only the required components of the nonvolatile semiconductor memory device relating to the first embodiment. Only those components that are necessary for explanation of data reading operation, program verification operation and erase verification operation are shown in this figure. Further, those components that perform same or similar functions to the components shown in FIG. 1 have been provided with the same legends and, to avoid repetition of explanation, their explanation will be omitted.

As can be seen from FIG. 2, the nonvolatile semiconductor memory device relating to this embodiment does not have the program verification voltage generator 26 and the erase verification voltage generator 28 shown in FIG. 1. Instead, in the nonvolatile semiconductor memory device relating to this embodiment, capacitors C20, C21 and C22 are provided in parallel at the output of the bit line of the source of the reference cell 30.

Further, a MOS transistor Tr31 is provided for ON/OFF controlling the charging/discharging of current to and from the capacitor C21, and a MOS transistor Tr32 is provided for ON/OFF controlling the charging/discharging of current to and from the capacitor C22. The capacitors, that have not been shown in the figures, disposed at the output of the bit line of the source of the memory cell array 20, in the same manner as the conventional nonvolatile semiconductor memory device, will be referred to as C10. The capacitors, that have not been shown in the figures, disposed at the output of the bit line of the source of the reference cell 30, in the same manner as the conventional nonvolatile semiconductor memory device, will be referred to as C11. These capacitors C10 and C11 are different these from the capacitors C20, C21 and C22.

Data reading operation, program verification operation and erase verification operation of the nonvolatile semiconductor memory device related to this embodiment will be explained in this order with reference to waveforms shown in FIG. 3 and FIG. 4. Since data reading and erasing operations are performed in the same manner as in the conventional nonvolatile semiconductor memory, explanation about these operations will be omitted.

Data Reading Operation:

During the data reading operation, p-type MOS transistors Tr11 and Tr21 are made ON using the signals PD1 and PD2 respectively (see FIG. 2).

The address of a cell to be read (hereafter, reading cell) is specified as follows. That is, a not shown column decoder turns ON the MOS transistors of the address shown among MOS transistors connected to the bit line 21 (DS0, DS1) at the drain side and the bit line 23 (SS0, SS1) at the source side respectively. A row decoder 22 applies a reading voltage supplied from a reading voltage generator 24 to a word line of the address shown among word lines WL0 to WLn.

Thus, a reading cell from which data is to be read out is selected or specified by selecting a bit line and a word line corresponding to that cell. The reading voltage is applied to a control gate of the selected cell to be read. In this state, MOS transistors Tr12 and Tr13 are turned ON by a column selection signal CS. As a result, the selected bit line becomes valid, and it becomes possible to read the data stored in the reading cell.

On the other hand, with respect to the reference cell 30, there are disposed MOS transistors Tr22, Tr23, Tr25 and Tr26 having characteristics similar to those of the MOS transistors that are controlled in the operation of the reading cell. These transistors are disposed by taking into consideration characteristics of currents that are input into the sense amplifier 40 during the data reading operation, program verification operation and erase verification operation respectively. These MOS transistors are always ON.

The reference word line driver 32 applies a reading voltage supplied from the reading voltage generator 24 to the control gate of the reference cell 30 via a word line WLref, along the operation at the memory cell array 20 side.

Figure 3:
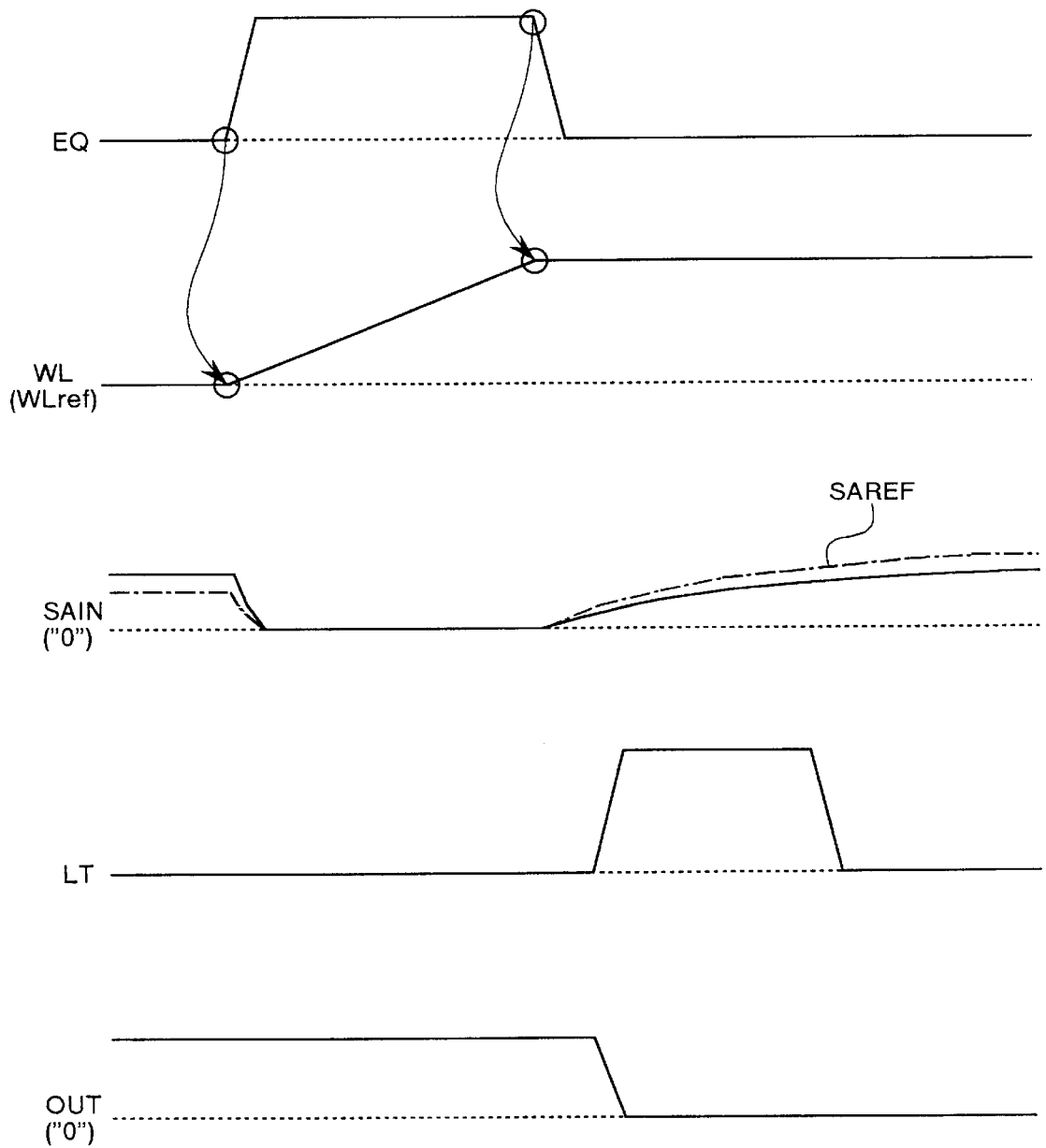
FIG. 3 is a waveform diagram for explaining an operation of the nonvolatile semiconductor memory device relating to the first embodiment.

As shown in FIG. 3, a signal EQ is shifted to a high level until when the reading voltage applied to the word lines WL and WLref has sufficiently risen. In other words, when the reading voltage is applied, the signal EQ that is at the high level is also input into the gates of the MOS transistors Tr14 and Tr24 so that the MOS transistors Tr14 and Tr24 are turned ON.

A high-level signal output from an inverter G1 based on a low-level signal ERV is applied to a gate of a MOS transistor Tr31 so that the MOS transistor Tr31 is turned ON. A high-level signal PGMV is input to the MOS transistor Tr32 so that the MOS transistor Tr32 is turned ON. As a result, electric charge stored in the capacitors C10, C11, C21, C22, and C23 is discharged (reset).

When the reading voltage applied to the word lines WL and WLref has sufficiently risen, the signal EQ is shifted to a low level. As a result, the MOS transistors Tr14 and Tr24 are turned OFF. In this case, the signal ERV is shifted to a high level, the signal PGMV is shifted to a low level, and the MOS transistors Tr31 and Tr32 are turned OFF. In other words, in place of the capacitor C11, the capacities C20 and C21 are connected in parallel at the reference cell 30 side.

Thus, a signal output from the bit line at the source of the memory cell array 20 is input as signal SAIN to the sense amplifier 40 via the MOS transistor Tr13. This signal SAIN actually appears as a change in the potential between the capacities.

Regarding the reference cell 30, a signal output from the bit line at the source side is input as signal SAREF to the sense amplifier 40. This signal SAREF also appears as a change in the potential between the capacities.

The sense amplifier 40 detects a change in the potential between the signal SAIN and the signal SAREF. In other words, the sense amplifier 40 detects a speed of charging to each of the above mentioned capacitors, thereby to calculate a potential difference between the signal SAIN and the signal SAREF.

For example, consider a case where the charging speed of the capacitor C10 to be lower than the charging speed of any of the capacitors C11, C20 and C21 and that the potential of the signal SAIN is smaller than the potential of the signal SAREF at a timing when signal LT has become a high level as shown in FIG. 3. In this case the sense amplifier 40 decides that hot electrons have been injected into the floating gate, and outputs data "0" as a signal OUT.

Figure 4:
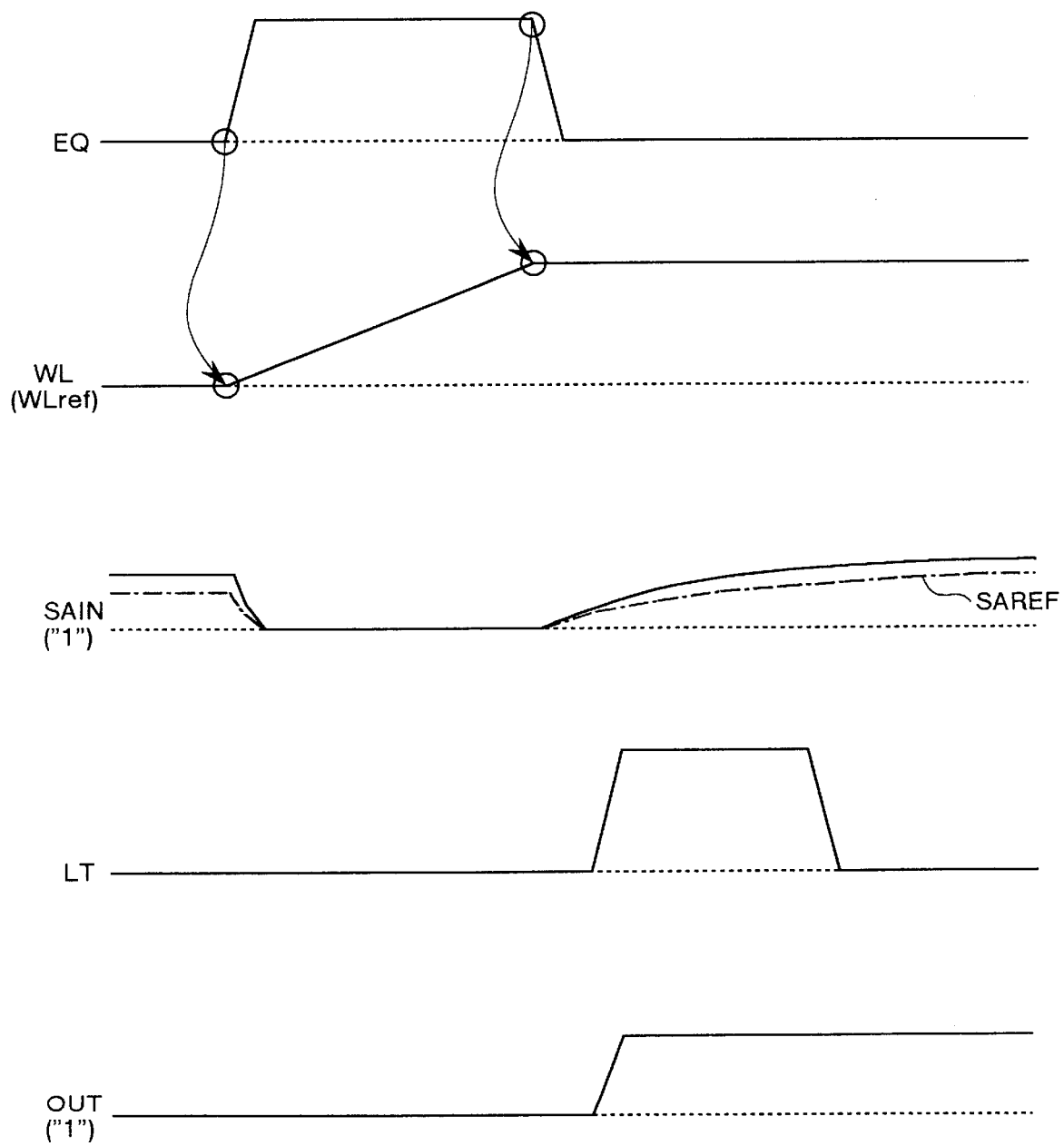
FIG. 4 is a waveform diagram for explaining an operation of the nonvolatile semiconductor memory device relating to the first embodiment.

On the other hand, when the charging speed of the capacitor C10 is higher than the charging speed of any of the capacitors C11, C20 and C21 and when the potential of the signal SAIN is larger than the potential of the signal SAREF at a timing when signal LT has shifted to a high level as shown in FIG. 4, the sense amplifier 40 decides that electrons have been extracted from the floating gate, and outputs data "1" as the signal OUT.

Program Verification Operation:

In the program verification operation, a reading cell of the memory cell array 20 is selected at in a similar manner as in the data reading operation. However, with respect to the reference cell 30, the MOS transistors Tr31 and Tr32 are turned ON when the signal ERV has been shifted to a low level and the signal PGMV has been shifted to a high level. The capacitor C22 is charged along with the capacitors C11, C20 and C21 based on current supplied from the bit line at the source of the reference cell 30.

Thus the capacitor C22 is connected in parallel during the verification operation in addition to the capacitors connected during the reading operation. As a consequence, the charging speed, which is represented as a value of the SAREF signal, decrease as compared to the same during the data reading. Therefore, when the signal SAIN has become much smaller than the signal SAREF of which potential has been reduced, the sense amplifier 40 decides that a programming operation has been carried out normally, and outputs data "0" as the signal OUT.

This means that it is possible to carry out a program verification operation without changing a voltage to be applied to the control gate of the reference cell 30, that is, without providing a program verification voltage generator.

Erase Verification Operation:

In the program verification operation, a reading cell of the memory cell array 20 is selected at in a similar manner as in the data reading operation. However, with respect to the reference cell 30, the MOS transistors Tr31 and Tr32 are turned OFF when the signal ERV has been shifted to a high level and the signal PGMV has been shifted to a low level. A current supplied from the bit line at the source of the reference cell 30 charges the capacitors C11 and C20.

As the capacitor C21 is disconnected and therefore the capacitance decreases as compared to the capacitance during the data reading operation. As a consequence, the charging speed, represented by the signal SAREF, increases as compared to the same during the data reading operation. Therefore, when the signal SAIN has become much larger than the signal SAREF of which potential has been increased, the sense amplifier 40 decides that the erasing operation has been carried out normally, and outputs data "1" as the signal OUT.

This means that it is possible to carry out the erase verification operation without changing a voltage to be applied to the control gate of the reference cell 30, that is, without providing a program verification voltage generator. As explained above, according to the nonvolatile semiconductor memory device relating to the first embodiment of the invention, the program verification operation is provided with the capacitor C11 that is connected in parallel to the output of the bit line at the source of the reference cell 30, the capacitor C20 that is additionally connected in parallel, the capacitor C21 that is connected in parallel during the data reading operation and during the program verification operation respectively and that is disconnected during the erase verification operation, and the capacitor C22 that is connected in parallel during the program verification operation. Therefore, it is possible to increase or decrease the potential of the signal SAREF output from the reference cell 30 according to the program verification operation and the erase verification operation. This makes it possible to exclude the program verification voltage generator and the erase verification voltage generator that have been necessary in the conventional nonvolatile semiconductor memory device. As a result, it is possible to simplify and reduce the size of the structure of the nonvolatile semiconductor memory device, and also to save power consumption.

Nonvolatile semiconductor memory device relating to a second embodiment of the present invention will be explained below. The nonvolatile semiconductor memory device relating to the second embodiment is a one having a structure for storing a multi-value in a memory cell to which the concept of the verification operation of the first embodiment explained above has been applied.

According to the nonvolatile semiconductor memory device relating to the first embodiment, it is possible to store a binary value in the memory cell to show whether or not a hot electron has been injected to the floating gate as one constituent element of the memory cell. However, there has also been known amemory cell for storing a multi-value, as disclosed, for example, in Japanese Patent Application Publication No. 7-273227, "A nonvolatile multi-value memory element and a device using the same" by the same applicant as the applicant of the present invention.

According to this "A nonvolatile multi-value memory element and a device using the same", a plurality of floating gates are formed between a control gate and a semiconductor substrate. For one increment of a multi-value, an electric charge is injected into each of the plurality of floating gates so that a threshold value changes by approximately a constant value. With this arrangement, it is possible to store a multi-value in the same area as that for a binary memory element, and it is also possible to easily make a decision on a memory value.

Figure 5:
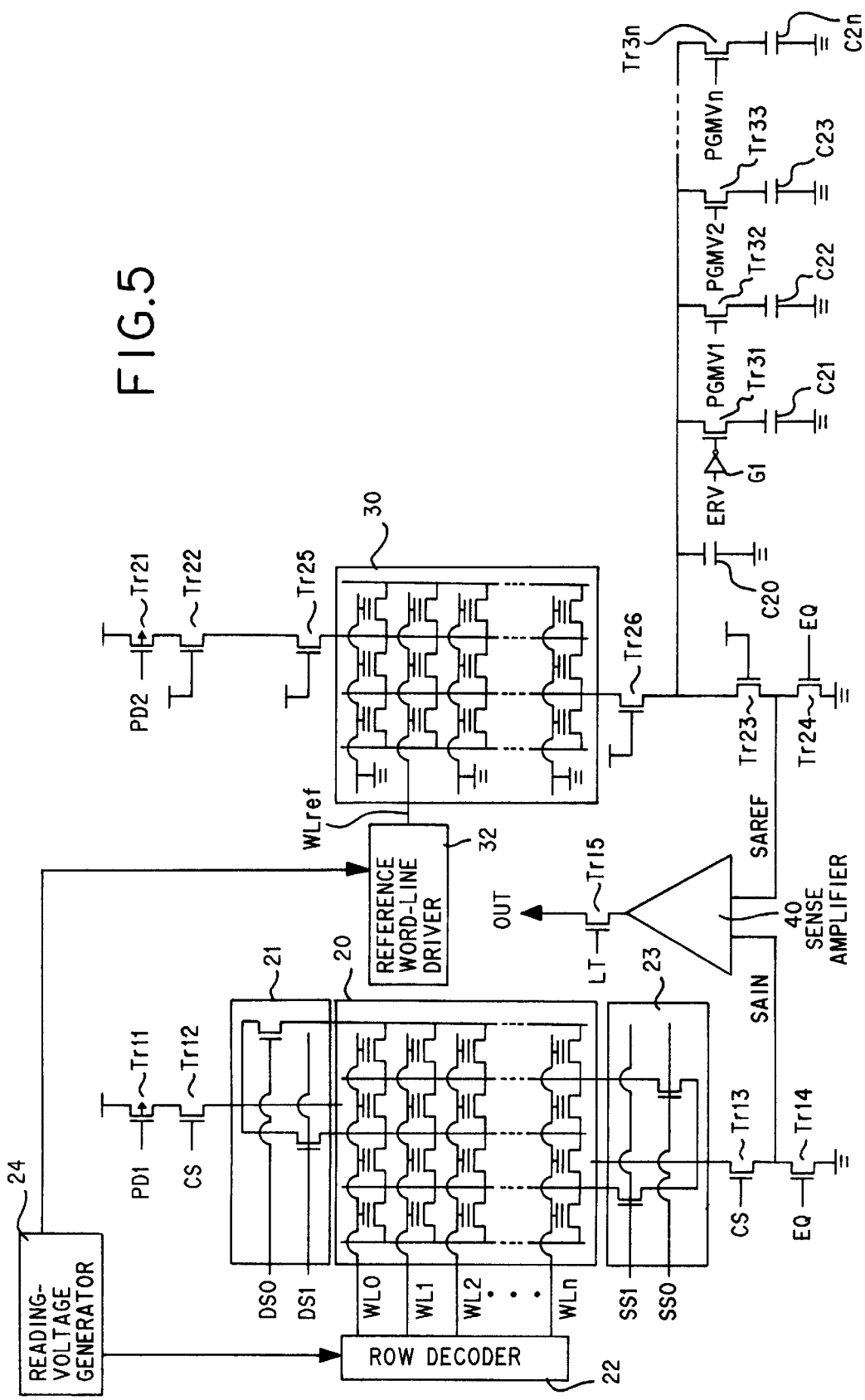
FIG. 5 is a circuit diagram showing key elements of a nonvolatile semiconductor memory device relating to a second embodiment of the present invention.

FIG. 5 is a circuit diagram which shows only the required components of the nonvolatile semiconductor memory device relating to the first embodiment. Only those components that are necessary for explanation of data reading operation, program verification operation and erase verification operation are shown in this figure. Further, those components that perform same or similar functions to the components shown in FIG. 2 have been provided with the same legends and, to avoid repetition of explanation, their explanation will be omitted FIG. 5 is different from FIG. 2 in that a plurality of capacitors C23 to C2n for carrying out a program verification operation are connected, in addition to capacitors C20 and C21, in parallel to the bit line at the source of a reference cell 30.

The capacitors C23 to C2n are provided with MOS transistors Tr33 to Tr3n for selectively ON/OFF controlling the connection of these capacitors to the bit line at the source side, to have a similar structure to that consisting of the capacitor C22 and the MOS transistor Tr32. In FIG. 5, each of a reading cell that constitutes a memory cell array 20 and a memory cell that constitutes a reference cell 30 has a structure that makes it possible to achieve a multi-value storing.

Data reading operation, program verification operation and erase verification operation by the nonvolatile semiconductor memory device will be explained below. Since data erasing operation is performed in the same manner as in the conventional nonvolatile semiconductor memory device, explanation about this operation will be omitted. The data programming operation is carried out by applying a voltage depending on the stored multi-value, to the control gate of the reading cell, and by changing the amount of hot electrons to be injected to the floating gate.

Data Reading Operation:

The data reading operation is similar to that of the first embodiment, therefore, its explanation will be omitted. However, the sense amplifier 40 needs to make a decision on a multi-value according to a difference between a signal SAIN and a signal SAREF detected, for example. Thus, the signal OUT output from the sense amplifier 40 has a voltage determined based on the above difference. For example, signals OUT having values of 5V, 6V, 7V and 8V are decided as memory values "1", "2", "3" and "4" respectively.

Program Verification Operation:

In the program verification operation, a reading cell of the memory cell array 20 is selected at in a similar manner as in the data reading operation. However, with respect to the reference cell 30, a signal ERV is shifted to a low level, and signals PGMV1 to PGMVn are shifted to a high level according to a programmed memory value. As a result, the MOS transistor Tr31 and some of the MOS transistors Tr32 to Tr3n are selectively turned ON. Some of the capacitors C22 to C2n are charged together with the capacitors C11, C20 and C21 by current supplied from the bit line at the source of the reference cell 30.

For carrying out a program verification operation of the memory value "1", for example, the signal ERV is set to a low level, and the signal PGMV1 is set to a high level. For carrying out a program verification operation of the memory value "2", the signal ERV is set to a low level, and the signals PGMV1 and PGMV2 are set to a high level. As explained, each time when a memory value is incremented, the signals PGMV1 to PGMVn for shifting to a higher level is sequentially superimposed.

In other words, the capacitors C22 to C2n are further connected in parallel in superimposition as compared with the capacitors connection during a data reading operation. As a consequence, the charging speed represented by the signal SAREF, decreases as compared to the same during the data reading operation, and changes according to a memory value. Therefore, when the signal SAIN has become much smaller within a range corresponding to a memory value than the signal SAREF of which potential has become smaller, the sense amplifier 40 decides that the programming operation has been carried out normally, and outputs the memory value as the signal OUT.

This means that it is possible to carry out a multi-value program verification operation without changing a voltage to be applied to the control gate of the reference cell 30, that is, without providing a program verification voltage generator.

Erase Verification Operation:

In the program verification operation, a reading cell of the memory cell array 20 is selected at in a similar manner as in the data reading operation. However, with respect to the reference cell 30, a signal ERV is shifted to a high level, and signals PGMV1 to PGMVn are all shifted to a low level. As a result, all MOS transistor from Tr31 to Tr3n are turned OFF. A current supplied from the bit line at the source of the reference cell 30 charges the capacitors C11 and C20.

In other words, the capacitor C21 is disconnected. Thus, the charging speed represented by the signal SAREF, decreases as compared to the same during the data reading operation. Accordingly, when the signal SAIN has become much larger than the SAREF signal of which potential has become larger, the sense amplifier 40 decides that the erasing operation has been carried out normally, and outputs a value showing an erased state as the signal OUT.

This means that it is possible to carry out a multi-value erase verification operation without changing a voltage to be applied to the control gate of the reference cell 30, that is, without providing an erase verification voltage generator.

As explained above, according to the nonvolatile semiconductor memory device relating to the second embodiment of the invention, the program verification operation is provided with the capacitor C11 that is connected in parallel to the output of the bit line at the source of the reference cell 30, the capacitor C20 that is additionally connected in parallel, the capacitor C21 that is connected in parallel according to a multi-value memory state during the data reading operation and during the program verification operation respectively and that is disconnected during the erase verification operation, and the capacitors C22 to C2n that are connected in parallel according to a multi-value memory state during the program verification operation. Therefore, the multi-value storing nonvolatile semiconductor memory device can also enjoythe same effects as those of the first embodiment.

According to the present invention, it is possible to increase or decrease the charging speed of current flowing to the reference memory cell according to the program verification operation and the erase verification operation. This has an effect that it is possible to exclude the program verification voltage generator and the erase verification voltage generator that have been necessary in the past. As a result, it is possible to provide a nonvolatile semiconductor memory device in a simple structure that can save power consumption.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A nonvolatile semiconductor memory device comprising:
    an electrically erasable/writable data-storing memory cell;
    a reference memory cell for making a decision about a storage state of said data-storing memory cell;
    a first capacitor for charging the current output from said data-storing memory cell;
    a second capacitor for charging the current output from said reference memory cell; and
    a sense amplifier for detecting charging speed difference and electric potential difference between said first capacitor and said second capacitor, wherein
        the nonvolatile semiconductor memory device carries out a data reading operation, a program verification operation and an erase verification operation in the data-storing memory cell based on a result of the detection by the sense amplifier, and wherein
        the nonvolatile semiconductor memory device further comprises a capacitance changing unit which changes the capacitance of said second capacitor according to the data reading operation, the program verification operation and the erase verification operation.

2. The nonvolatile semiconductor memory device according to claim 1, wherein
    said capacitance changing unit increases the capacitance of said second capacitor during the program verification operation as compared to the same during the data reading operation, and said capacitance changing unit decreases the capacitance of said second capacitor during the program verification operation as compared to the same during the data reading operation.

3. The nonvolatile semiconductor memory device according to claim 1, wherein said data-storing memory cell and said reference memory cell are constructed of a multi-value storing memory, and during the program verification operation, said capacitance changing unit changes the capacitance of said second capacitor to a larger value than the capacitance during the data reading operation, in a different size of value according to a memory state shown by the multi-value, and during the erase verification operation, said capacitance changing unit changes the capacitance of said second capacitor to a smaller value than the capacitance value during the data reading operation.

4. The nonvolatile semiconductor memory device according to claim 1, wherein said capacitance changing unit changes the capacitance of said second capacitor by connecting a plurality of capacitors in parallel or by disconnecting these capacitors.

5. The nonvolatile semiconductor memory device according to claim 4, wherein said capacitance changing unit increases the capacitance of said second capacitor during the program verification operation as compared to the same during the data reading operation, and said capacitance changing unit decreases the capacitance of said second capacitor during the program verification operation as compared to the same during the data reading operation.

6. The nonvolatile semiconductor memory device according to claim 4, wherein said data-storing memory cell and said reference memory cell are constructed of a multi-value storing memory, and during the program verification operation, said capacitance changing unit changes the capacitance of said second capacitor to a larger value than the capacitance during the data reading operation, in a different size of value according to a memory state shown by the multi-value, and during the erase verification operation, said capacitance changing unit changes the capacitance of said second capacitor to a smaller value than the capacitance value during the data reading operation.

* * * * *